(12) United States Patent
Yao et al.

(10) Patent No.: US 9,423,430 B2
(45) Date of Patent: Aug. 23, 2016

(54) ACTIVE CURRENT MEASUREMENT CIRCUIT AND MEASUREMENT DEVICE

(71) Applicant: Danaher (Shanghai) Industrial Instrumentation Technologies R&D Co., Ltd., Shanghai (CN)

(72) Inventors: Hong Yao, Shanghai (CN); Fei Yang, Shanghai (CN); Yong Yang, Shanghai (CN)

(*) Notice: Subject to any disclaimer, the term of this patent is extended or adjusted under 35 U.S.C. 154(b) by 0 days.

(21) Appl. No.: 14/539,192

(22) Filed: Nov. 12, 2014

(65) Prior Publication Data

US 2015/0130484 A1    May 14, 2015

(30) Foreign Application Priority Data

Nov. 13, 2013 (CN) .......................... 2013 1 0571254

(51) Int. Cl.
*G01R 19/00* (2006.01)
*H02H 3/08* (2006.01)
*G01R 1/067* (2006.01)

(52) U.S. Cl.
CPC ....... *G01R 19/0092* (2013.01); *G01R 19/0023* (2013.01); *H02H 3/08* (2013.01); *G01R 1/06766* (2013.01); *G01R 19/0084* (2013.01)

(58) Field of Classification Search
CPC ..................... G01R 19/0023; G01R 19/0084; G01R 19/0092; G01R 1/06766; H02H 3/08
USPC ................. 324/713, 691, 649, 600
See application file for complete search history.

(56) References Cited

U.S. PATENT DOCUMENTS

| 4,771,233 A | 9/1988 | Wayne | |
|---|---|---|---|
| 7,548,708 B2* | 6/2009 | Nagasaki | G03G 15/80 310/318 |
| 8,970,214 B2* | 3/2015 | Tamura | B60L 3/0038 324/244 |
| 2005/0275394 A1* | 12/2005 | Moraveji | G05F 1/565 323/312 |
| 2009/0045825 A1* | 2/2009 | Eng, Jr. | G01R 27/08 324/713 |
| 2009/0072813 A1 | 3/2009 | Banhegyesi | |
| 2010/0194522 A1* | 8/2010 | Janning | H01C 7/13 338/22 R |
| 2012/0087053 A1* | 4/2012 | Mizui | H02H 9/025 361/93.7 |

FOREIGN PATENT DOCUMENTS

WO     2009/000236 A2    12/2008

OTHER PUBLICATIONS

Extended European Search Report, dated Apr. 20, 2015, for EP Application No. 14193047.9, 7 pages.

* cited by examiner

*Primary Examiner* — Hoai-An D Nguyen
(74) *Attorney, Agent, or Firm* — Seep IP Law Group PLLC

(57) ABSTRACT

The current sensing circuit includes a first input terminal and a second input terminal for introducing a subject current that flows in a current path; a shunt resistor coupled in the current path for converting the subject current into an output voltage difference across the shunt resistor; an amplifier having a first input node coupled to the first input terminal, a second input node coupled to the second input terminal, an output node, and a feedback path including an over-current protection device, wherein the feedback path is coupled between the output node and the first input terminal; and an output terminal coupled to the second input terminal and the shunt resistor to output the output voltage difference. The current sensing circuit has a relatively large current measuring range and a small burden voltage. A measurement device is also described.

13 Claims, 2 Drawing Sheets

ACTIVE CURRENT MEASUREMENT CIRCUIT AND MEASUREMENT DEVICE

FIELD

The present application relates to electronic measurement technology, and more particularly to a current sensing circuit and a measurement device using the current sensing circuit.

BACKGROUND

Various measurement devices for measuring electrical parameters (such as voltage, current and resistance) are widely used in industry and daily life. A multi-meter is a typical electronic measurement device, which is mainly used for measuring AC and/or DC voltages, currents and resistors. A typical multi-meter generally has a pair of test leads, each having one end connected to a subject apparatus or device and the other end inserted into a corresponding jack on a panel of the multi-meter, thus electrically connecting the subject equipment to the measuring circuit in the multi-meter.

Generally, a voltage difference (i.e., burden voltage) between two input terminals of a current sensing circuit needs to be maintained within a specific range to prevent the voltage difference from affecting the subject device. However, in conventional current sensing circuits such as a current sensing circuit shown in FIG. 1, a shunt resistor 11 is coupled between the two input terminals. Hence, it is difficult to use a large shunt resistor to obtain a better signal-to-noise ratio.

As shown in FIG. 1, the current sensing circuit 10 includes the shunt resistor 11, an amplifier 12, and a fuse 13. The shunt resistor 11 is connected in series with a subject device (not shown), thus converting the subject current $I_S$ into a voltage drop across the shunt resistor. Moreover, the amplifier 12 is configured as a voltage follower, with its non-inverting input node coupled to the shunt resistor 11 to sample the voltage drop, and its inverting input node coupled to an output node of the amplifier 12 to transfer the voltage drop to the output node. In the current sensing circuit 10, the fuse 13 is connected in series with the subject device and the shunt resistor 11, which is activated in case that the subject current $I_S$ exceeds a predetermined magnitude to prevent damage of the current sensing circuit 10 due to the excessive current.

However, for the current sensing circuit 10 shown in FIG. 1, the burden voltage (the voltage between the two input terminals coupled to the subject device) is equal to the sum of a voltage generated according to an input impedance (including the shunt resistor 11, the fuse 13, and a wire distribution resistance $R_W$) of the current sensing circuit 10 and an input offset voltage of the amplifier 12. Apparently, the burden voltage of the current sensing circuit 10 increases with the subject current. Thus, the fuse 13 and the shunt resistor 11 in the current sensing circuit 10 should be as small as possible. However, it is difficult to obtain a high signal-to-noise ratio if the shunt resistor 11 having a small resistance is used in the current sensing circuit 10.

FIG. 2 shows another typical current sensing circuit 20. As shown in FIG. 2, the current sensing circuit 20 includes a shunt resistor 21, an amplifier 22, and a fuse 23. The shunt resistor 21 is coupled in a feedback loop of the amplifier 22, i.e., between an inverting input node and an output node of the amplifier 22. Thus, the shunt resistor 21 does not affect the burden voltage between the two input terminals of the current sensing circuit 20. The burden voltage is mainly determined according to the voltage drop across the fuse 23 and the wire distribution resistor, which are generated by the subject current flowing therethrough. However, the fuse 23 generally has a non-negligible resistance, and the voltage drop across the fuse 23 may significantly affect the burden voltage if the subject current is large. Thus, the current sensing circuit 20 still needs to use a fuse having a small impedance, therefore, it is not suitable for measuring large currents.

SUMMARY

An objective of the present application is to provide a current sensing circuit having a relatively large current measuring range and a small burden voltage.

In one aspect, the present application provides a current sensing circuit including a first input terminal and a second input terminal for introducing a subject current that flows in a current path; a shunt resistor coupled in the current path for converting the subject current into an output voltage difference across the shunt resistor; an amplifier having a first input node coupled to the first input terminal, a second input node coupled to the second input terminal, an output node, and a feedback path comprising an over-current protection device, wherein the feedback path is coupled between the output node and the first input terminal; and an output terminal coupled to the second input terminal and the shunt resistor to output the output voltage difference.

With respect to the above current sensing circuit, a burden voltage between the two input terminals is related to an input offset voltage, rather than the voltage drop across the shunt resistor and the over-current protection device generated by the subject current. Thus, the current sensing circuit can measure a large subject current while maintaining its burden voltage at a substantially low level. In certain embodiments, the burden voltage is substantially close to zero.

In certain embodiments, the current sensing circuit further includes a protection resistor coupled between the first input terminal and the first input node, and a capacitor coupled between the first input node and the output node. This protection resistor usually has a large resistance and rated power, thereby protecting the input nodes of the amplifier.

In certain embodiments, the over-current protection device is a fuse.

In certain embodiments, the fuse is a resettable fuse. The resettable fuse can restore to a normal conductive state after an over-current shutdown is resolved and does not require the users to replace it, thereby enhancing the measuring efficiency.

In certain embodiments, the fuse is a positive temperature coefficient thermistor.

In certain embodiments, the shunt resistor is coupled between the output terminal and a reference line.

In another aspect, the present application further provides a measurement device including a first test lead and a second test lead for introducing a subject current flowing in a current path; a shunt resistor coupled in the current path for converting the subject current into an output voltage difference across the shunt resistor; an amplifier having a first input node coupled to the first test lead, a second input node coupled to the second test lead, an output node, and a feedback path comprising an over-current protection device, wherein the feedback path is coupled between the output node and the first test lead; and an output terminal coupled to the second test lead and the shunt resistor to output the output voltage difference.

In certain embodiments, the measurement device is a multi-meter.

The foregoing description has outlined, rather broadly, features of the present application. Additional features of the present application will be described, hereinafter, which form the subject matter in support of the claims of the present application. It should be appreciated by those skilled in the art that the concepts and specific embodiments disclosed herein may be readily utilized as a basis for modifying or designing other structures or processes for carrying out the objectives of the present application. It should also be realized by those skilled in the art that such equivalent constructions do not depart from the spirit and scope of the present application as set forth in the appended claims.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

The following detailed description refers to the accompanying drawings as a part of the present application. The illustrative embodiments described in the detailed description, the accompanying drawings, and the claims are not limiting, and other embodiments may be adopted, or modifications may be made without deviating from the spirit and subject of the application. It should be understood that the various aspects of the application described and graphically presented herein may be arranged, replaced, combined, divided, and designed in many different configurations, and these different configurations are implicitly comprised in the application.

Figure 1:
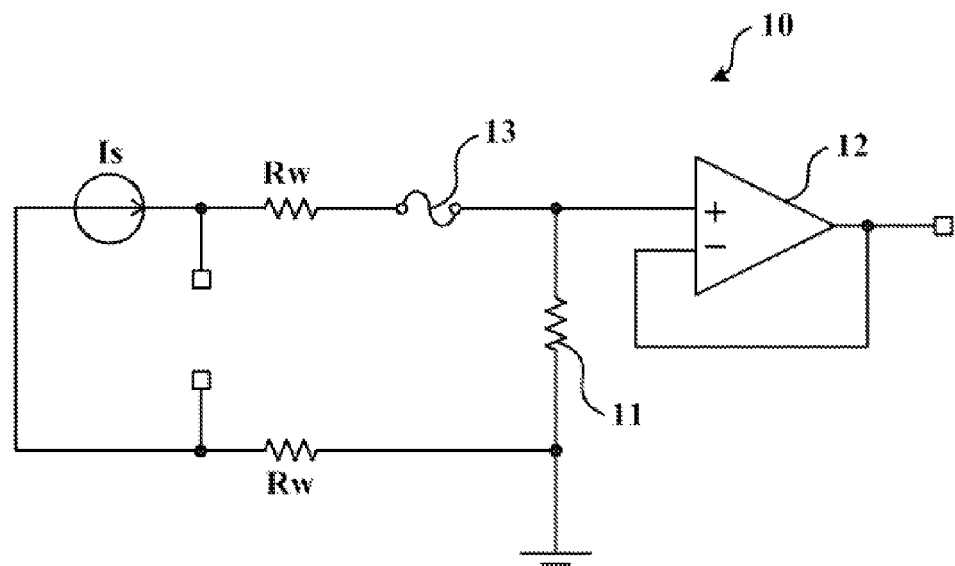
FIG. 1 shows a conventional current sensing circuit.
Figure 2:
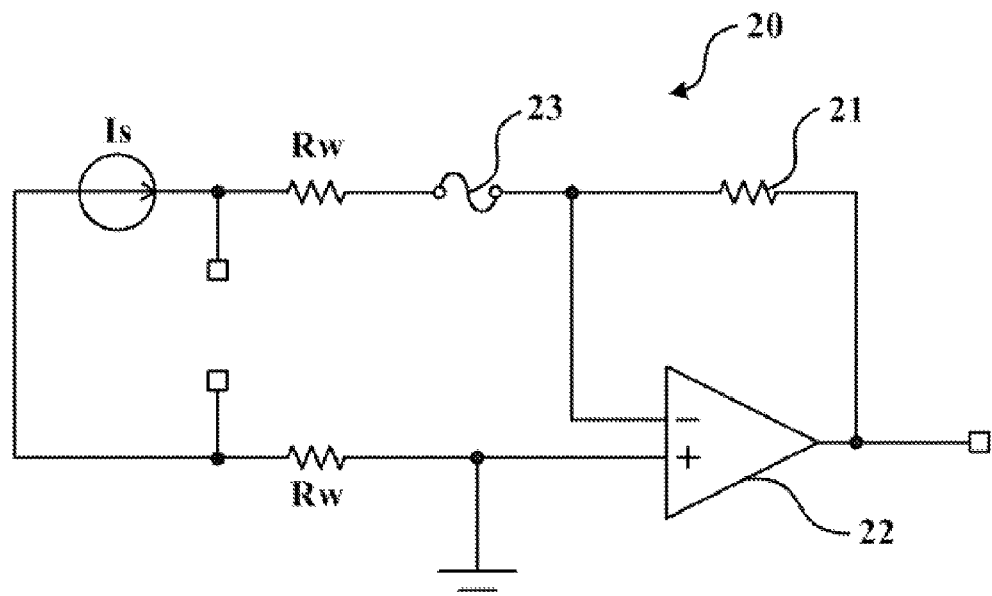
FIG. 2 shows another conventional current sensing circuit.
Figure 3:
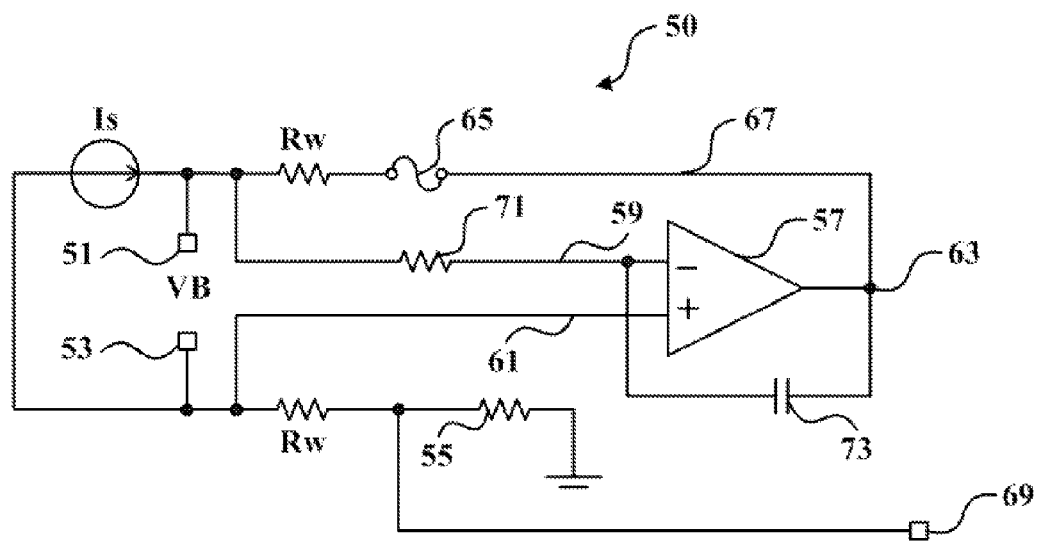
FIG. 3 shows a current sensing circuit according to an embodiment of the present application.

FIG. 3 shows a current sensing circuit 50 according to an embodiment of the present application. The current sensing circuit 50 can be used as a signal sampling circuit in a current measurement device (e.g., a multi-meter) to convert a double-ended input subject current signal into a single-ended output voltage signal, which can be further converted into, for example, a digital signal indicating the magnitude of the subject current by a post-stage circuit (e.g., an analog-digital conversion circuit).

As shown in FIG. 3, the current sensing circuit 50 includes:

a first input terminal 51 and a second input terminal 53 for introducing a subject current $I_S$ that flows in a current path;

a shunt resistor 55 coupled in the current path for converting the subject current $I_S$ into an output voltage difference across the shunt resistor 55;

an amplifier 57 having a first input node 59 coupled to the first input terminal 51, a second input node 61 coupled to the second input terminal 53, an output node 63, and a feedback path 67 having an over-current protection device 65, wherein the feedback path 67 is coupled between the output node 63 and the first input terminal 51; and an output terminal 69 coupled to the second input terminal 53 and the shunt resistor 55 to output the output voltage difference.

In the current sensing circuit 50 shown in FIG. 3, the amplifier 57 is an operational amplifier. The first input node 59 is an inverting input node of the operational amplifier and the second input node 61 is a non-inverting input node of the operational amplifier. Since the first input node 59 is coupled to the first input terminal 51, the feedback path 67 is coupled between the output node 63 of the amplifier 57 and the first input node 59 so that the amplifier 57 operates in the negative feedback mode. Moreover, as the input impedance at input nodes of an operational amplifier is relatively large, there may be substantially little current flowing into or from the amplifier 57 through the first input node 59 and the second input node 61. Therefore, when a subject device (not shown) is connected to the current sensing circuit 50 and the subject current $I_S$ flowing through the subject device is generated, the subject current $I_S$ further flows through the shunt resistor 55 and the over-current protection device 65. In other words, the shunt resistor 55 and the over-current protection device 65 are coupled in the current path of the subject current $I_S$ and in series with the subject device. Assuming that the subject current $I_S$ flows in the current direction shown in FIG. 3, then the subject current $I_S$ flows from a reference line (e.g., the ground), successively through the shunt resistor 55, the subject device (through the second input terminal 53 and the first input terminal 51), the over-current protection device 65, and the output node 63 of the amplifier 57, and back to the reference line through the output node 63 and the power supply.

It can be seen that the subject current $I_S$ flows through the shunt resistor 55 and generates the output voltage difference thereon. The magnitude of the output voltage difference is proportional to that of the subject current $I_S$. In certain embodiments, the shunt resistor 55 is coupled between the output terminal 69 and the reference line. As a result, the output voltage difference is converted into a single-ended voltage signal. In certain embodiments, the output terminal 69 of the current sensing circuit 50 may be coupled to a post-stage circuit such as an analog-digital converter. The post-stage circuit can further convert the output voltage difference into a digital signal indicating the magnitude of the subject current $I_S$ and display the digital signal to the users through, for example, a display module, or provide to the users in other forms.

Since the over-current protection device 65 is also coupled in the current path of the subject current $I_S$, the over-current protection device 65 can be switched on or off in response to the subject current $I_S$ flowing therethrough. Specifically, when the subject current $I_S$ is small, the over-current protection device 65 functions equivalent to a resistor of a small resistance, which would substantially not affect the measurement of the subject current $I_S$. However, when the subject current $I_S$ exceeds a maximum rated current of the over-current protection device 65, the over-current protection device 65 may be activated to switch off the current path, thus the current sensing circuit 50 does not work to conduct the current measurement.

In certain embodiments, the current sensing circuit 50 further includes a protection resistor 71 and a capacitor 73. The protection resistor 71 is coupled between the first input terminal 51 and the first input node 59, and the capacitor 73 is coupled between the first input node 59 of the amplifier 57 and the output node 63. The protection resistor 71 can protect the first amplifier 57. Specifically, when the over-current protection device 65 is activated and switches off the current path, the protection resistor 71 makes the input impedance of the operational amplifier higher to prevent the high voltage between the input terminals 51 and 53 from being directly applied between the input nodes 59 and 61 of the operational amplifier, thereby preventing damage of the operational amplifier due to the excessive input voltage. Moreover, when the over-current protection device 65 is in the conducting state, the subject current $I_S$ will not flow into the amplifier 57 through the protection resistor 71 and the first input node 59. Thus, there is no voltage drop across the protection resistor 71, and the voltage at the first input terminal 51 is equal to that at the first input node 59. As a result, the protection resistor 71 will not affect the normal operation of the current sensing circuit 50. The capacitor 73 is used for frequency compensation of the circuit 50.

According to the "virtual short-circuit" feature of operational amplifiers, the voltages at two input nodes of an ideal operational amplifier (whose input offset voltage is zero) operating in the negative feedback mode are equal with each other. Therefore, the voltage difference between the first input node 59 and the second input node 61 is close to zero, and the difference is of a magnitude only equal to the input offset voltage $V_{OS}$ of the operational amplifier. For most operational amplifiers, the input offset voltage $V_{OS}$ is merely of a very small magnitude, e.g., dozens to hundreds of microvolts (which depends on the structure and feature of the operational amplifiers). Furthermore, the first input terminal 51 and the second input terminal 53 are directly connected to the input nodes 59 and 61 of the amplifier 57, respectively. Therefore, the voltage difference between the first input terminal 51 and the second input terminal 53, i.e., the burden voltage $V_B$ of the current sensing circuit 50, is equal to the input offset voltage $V_{OS}$ of the operational amplifier. Also, the "virtual short-circuited" first input node 59 and second input node 61 significantly reduce the input impedance of the current sensing circuit 50.

A wire parasitic resistor $R_W$ is also shown in the circuit 50 in FIG. 3, which illustratively shows the parasitic resistance of the wires connecting the nodes of the circuit 50. The resistance of the wire parasitic resistor depends on the length, cross-sectional area and resistivity of the wires between various nodes. It will be appreciated that the wire parasitic resistor $R_W$ is a distributed resistor that is substantially uniformly distributed along the wires. In the embodiment, the first input node 59 and the second input node 61 of the amplifier 57 are coupled to the first input terminal 51 and the second input terminal 53, respectively. As there is no current flowing into or out of the amplifier 57 through the input nodes of the amplifier 57, the wire coupled between the first input node 59 and the first input terminal 51, and the wire coupled between the second input node 61 and the second input terminal 53, does not have a current flowing therein. Therefore, the parasitic resistance of the two wires will not affect the generated voltage drop, as well as the burden voltage $V_B$.

It can be seen that since the burden voltage $V_B$ of the current sensing circuit 50 is irrelevant to the voltage drop across the shunt resistor 55, the over-protection device 65 and the wire parasitic resistor $R_W$ generated by the subject current $I_S$, the current sensing circuit 50 can use a shunt resistor having a large resistance to improve the gain of the current sensing circuit 50 (corresponding to the resistance of the shunt resistor 55). It helps to improve the signal-to-noise ratio of the current sensing circuit 50 within the full range of current measurement.

In certain embodiments, the over-current protection device 65 may be a fuse such as a fuse made of lead-antimony alloy. In certain embodiments, the over-current protection device 65 may be a resettable fuse such as a positive temperature coefficient (PTC) thermistor. Although the impedance of the resettable fuse is generally slightly larger than that of the fuse made of lead-antimony alloy, the current sensing circuit 50 using the resettable fuse still has a quite small burden voltage $V_B$ since the voltage drop across the over-current protection device 65 does not affect the burden voltage $V_B$. Furthermore, the resettable fuse such as the PTC thermistor can work in a high-impedance state when the circuit is shut down (e.g., when the subject current is too large) so that the current sensing circuit 50 is in the switch-off state to prevent damage of the circuit. When the shutdown is resolved, the PTC thermistor can return to a low-impedance state automatically, allowing the circuit to work in the conducting state and to operate normally. Thus, when conducting measurements, the current sensing circuit 50 generally does not need to replace the over-current protection device due to the over-current shutdown, thereby significantly improving the measurement efficiency.

The current sensing circuit 50 shown in FIG. 3 is an active current sensing circuit, and the power consumption caused by the subject current flowing through the shunt resistor 55 and the over-current protection device 65 is supplied by the power supply of the current sensing circuit 50. Therefore, the current sensing circuit 50 is especially suitable for current measurements in application conditions such as industrial and laboratory measurements, where stable power supplies are provided.

Figure 4:
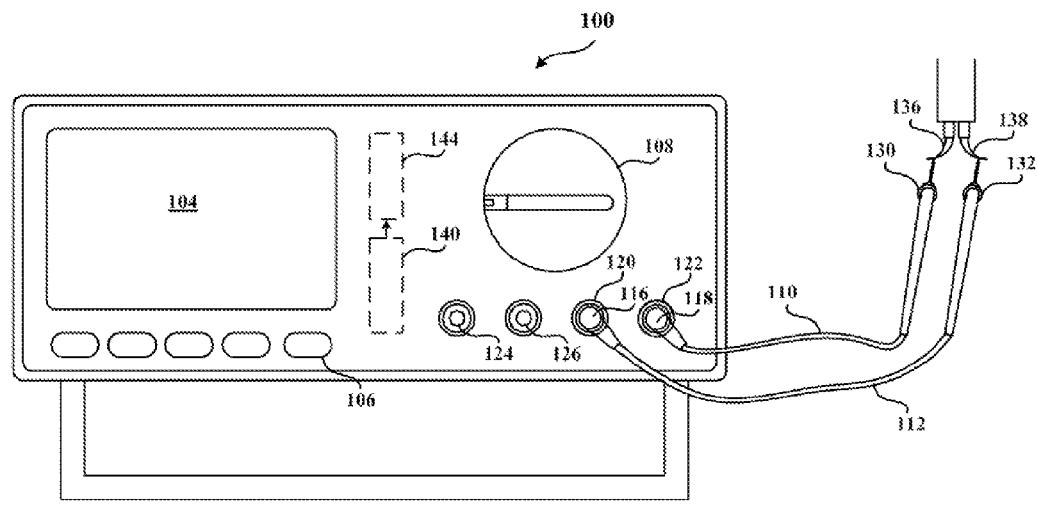
FIG. 4 shows a measurement device according to another embodiment of the present application.

FIG. 4 shows a multi-meter 100 using the current sensing circuit 50 shown in FIG. 3. It should be understood that the current sensing circuit of the present application can also be used in other measurement devices.

As shown in FIG. 4, the multi-meter 100 includes a digital display 104, manually operable buttons 106, and a rotatable mode selecting switch 108. The mode selecting switch 108 is shown in a position for measuring current. Although the multi-meter 100 uses the digital display 104, it should be understood that other types of display such as an analog meter can be used as well. Similarly, selectors other than the buttons 106 and the selecting switch 108 can be used. A pair of test wires 110, 112 has plugs 116 and 118, respectively. These two plugs 116 and 118 are plugged into jacks 120, 122 of the multi-meter 100 and further connected to the two input terminals of a current sensing circuit 140, respectively. The jacks 124 and 126 can also be used for insertion of one of the plugs 116 or 118 to measure resistance, voltage, or other electrical parameters in coordination with the selection of the mode selecting switch 108. The test wires 110 and 112 further have a first test lead 130 and a second test lead 132, which are connected to test points 136 and 138 on the subject device, respectively. The subject device is connected to the current sensing circuit 140 through the test wires 110 and 112. The two test leads introduce into the current sensing circuit 140 a subject current flowing in a current path. The output terminal of the current sensing circuit 140 is connected to a post-stage processing circuit 144 of the multi-meter 100, which processes an output voltage difference output by the current sensing circuit 140 and further provides the result to the display 104 where it is displayed as a digital readout.

It should be noted that, although several modules or sub-modules of the circuit have been described in the previous paragraphs, such division is exemplary and not mandatory. Practically, according to the embodiments of the present application, the functions and features of two or more modules described above may be embodied in one module. On the other hand, the function and feature of any one module described above may be embodied in two or more modules.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. Any reference signs in the claims should not be construed as limiting the scope. The scope and spirit of the present application is defined by the appended claims.

The embodiments of the invention in which an exclusive property or privilege is claimed are defined as follows:

1. A current sensing circuit, comprising:
   a first input terminal and a second input terminal for establishing a current path in which a subject current flows;
   a shunt resistor coupled in the current path for converting the subject current into an output voltage difference across the shunt resistor, wherein the shunt resistor is coupled between a reference line and the second input terminal;
   an amplifier having a first input node coupled to the first input terminal, a second input node coupled to the second input terminal, an output node, and a feedback path comprising an over-current protection device, wherein the feedback path is coupled between the output node and the first input terminal; and
   an output terminal coupled to the second input terminal and the shunt resistor to output the output voltage difference.

2. The current sensing circuit of claim 1, further comprising:
   a protection resistor coupled between the first input terminal and the first input node; and
   a capacitor coupled between the first input node and the output node.

3. The current sensing circuit of claim 1, wherein the over-current protection device is a fuse.

4. The current sensing circuit of claim 3, wherein the fuse is a resettable fuse.

5. The current sensing circuit of claim 4, wherein the fuse is a positive temperature coefficient thermistor.

6. The current sensing circuit of claim 1, wherein the shunt resistor is coupled between the output terminal and the reference line.

7. A measurement device, comprising:
   a first test lead and a second test lead for establishing a current path in which a subject current flows;
   a shunt resistor coupled in the current path for converting the subject current into an output voltage difference across the shunt resistor, wherein the shunt resistor is coupled between a reference line and the second test lead;
   an amplifier having a first input node coupled to the first test lead, a second input node coupled to the second test lead, an output node, and a feedback path comprising an over-current protection device, wherein the feedback path is coupled between the output node and the first test lead; and
   an output terminal coupled to the second test lead and the shunt resistor to output the output voltage difference.

8. The measurement device of claim 7, further comprising:
   a protection resistor coupled between the first test lead and the first input node; and
   a capacitor coupled between the first input node and the output node.

9. The measurement device of claim 7, wherein the over-current protection device is a fuse.

10. The measurement device of claim 9, wherein the fuse is a resettable fuse.

11. The measurement device of claim 10, wherein the fuse is a positive temperature coefficient thermistor.

12. The measurement device of claim 7, wherein the shunt resistor is coupled between the output terminal and a reference line.

13. The measurement device of claim 7, wherein the measurement device is a multi-meter.

* * * * *